(12) United States Patent
Wang et al.

(10) Patent No.: US 10,048,590 B2
(45) Date of Patent: **\*Aug. 14, 2018**

(54) METHOD AND APPARATUS OF PATTERNING A SEMICONDUCTOR DEVICE

(71) Applicant: TAIWAN SEMICONDUCTOR MANUFACTURING COMPANY, LTD., Hsin-Chu (TW)

(72) Inventors: Chien-Wei Wang, Wufong Township (TW); Ming-Feng Shieh, Yongkang (TW); Ching-Yu Chang, Yuansun Village (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 46 days.

This patent is subject to a terminal disclaimer.

(21) Appl. No.: 14/727,317

(22) Filed: Jun. 1, 2015

(65) Prior Publication Data

US 2015/0262835 A1    Sep. 17, 2015

Related U.S. Application Data

(63) Continuation of application No. 12/649,462, filed on Dec. 30, 2009, now Pat. No. 9,046,785.

(51) Int. Cl.
  *G03F 7/42*   (2006.01)
  *G03F 7/40*   (2006.01)
  (Continued)

(52) U.S. Cl.
  CPC .............. *G03F 7/42* (2013.01); *G03F 7/0045* (2013.01); *G03F 7/40* (2013.01); *G03F 7/422* (2013.01);
  (Continued)

(58) Field of Classification Search
  None
  See application file for complete search history.

(56) References Cited

U.S. PATENT DOCUMENTS 4,793,692 A * 12/1988 Kamio .............. G02F 1/133516
                                                    252/582
4,996,136 A    2/1991 Houlihan et al.
(Continued)

FOREIGN PATENT DOCUMENTS

JP           11-95436        4/1999

OTHER PUBLICATIONS

Derwent English abstract for JP11-95436 (1999).*
(Continued)

*Primary Examiner* — Sin J Lee
(74) *Attorney, Agent, or Firm* — Haynes and Boone, LLP (57) ABSTRACT

Provided is a photoresist that includes a polymer having a backbone that is breakable and a photo acid generator that is free of bonding from the polymer. Further, provided is a method of fabricating a semiconductor device. The method includes providing a device substrate. A material layer is formed over the substrate. A photoresist material is formed over the material layer. The photoresist material has a polymer that includes a backbone. The photoresist material is patterned to form a patterned photoresist layer. A fabrication process is then performed to the material layer, wherein the patterned photoresist layer serves as a mask in the fabrication process. Thereafter, the patterned photoresist layer is treated in a manner that breaks the backbone of the polymer. The patterned photoresist layer is then removed.

20 Claims, 6 Drawing Sheets

(51) Int. Cl.
  *G03F 7/004* (2006.01)
  *G03F 7/039* (2006.01)
  *G03F 7/038* (2006.01)
  *H01L 21/311* (2006.01)
  *H01L 21/306* (2006.01)

(52) U.S. Cl.
  CPC ........ G03F 7/423 (2013.01); H01L 21/30604 (2013.01); H01L 21/31133 (2013.01); *G03F 7/0382* (2013.01); *G03F 7/0392* (2013.01)

(56) References Cited

U.S. PATENT DOCUMENTS

| | | |
|---|---|---|
| 5,314,978 A | 5/1994 | Kim et al. |
| 6,210,856 B1 | 4/2001 | Lin et al. |
| 8,216,767 B2 | 7/2012 | Wang et al. |
| 8,323,870 B2 | 12/2012 | Lee et al. |
| 8,580,117 B2 | 11/2013 | Kao et al. |
| 8,658,344 B2 | 2/2014 | Wang et al. |
| 8,715,919 B2 | 5/2014 | Chang et al. |
| 8,741,551 B2 | 6/2014 | Wu et al. |
| 9,046,785 B2 * | 6/2015 | Wang ..................... G03F 7/42 |
| 2004/0242016 A1 | 12/2004 | Yates |
| 2005/0175936 A1 | 8/2005 | Yamamoto et al. |
| 2006/0068318 A1 | 3/2006 | Meagley et al. |
| 2008/0108223 A1 | 5/2008 | Wang et al. |
| 2008/0241746 A1 | 10/2008 | Fukuhara et al. |
| 2008/0318165 A1 * | 12/2008 | Tanaka ................. C09D 183/04 430/313 |
| 2010/0203450 A1 | 8/2010 | Fujiwara et al. |
| 2011/0159670 A1 | 6/2011 | Wang et al. |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273521 A1 | 9/2014 | Wu et al. |

OTHER PUBLICATIONS

Machine-assisted English translation for JP11-95436 (1999), as provided by JPO.*
JP English Abstract for JP11-95436 (1999).
Thompson et al ("A New Family of Positive Electron Beam Resists-Poly(Olefin Sulfones)".Journal of The Electrochemical Society, vol. 120(12), p. 1722-1726 (1973)).

* cited by examiner

METHOD AND APPARATUS OF PATTERNING A SEMICONDUCTOR DEVICE

PRIORITY DATA

The present application is a continuation application of U.S. patent application Ser. No. 12/649,462 filed Dec. 30, 2009, entitled "METHOD AND APPARATUS OF PATTERNING A SEMICONDUCTOR DEVICE", which is hereby incorporated by reference in its entirety.

TECHNICAL FIELD

The present disclosure relates generally to a semiconductor device, and more particularly, to a photoresist material.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Various photolithography processes may need to be performed to fabricate these increasingly small ICs. A photoresist material is used in the photolithography processes. In particular, the photoresist material is often used to pattern the ICs and is removed after the patterning is complete. However, existing photoresist materials and the methods of their removal have shortcomings. These shortcomings may include damage to the layers below the photoresist material and/or incomplete removal of the photoresist material, which may lead to defects in later processes and may result in reductions in yield.

Therefore, while existing photoresist materials have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

One of the broader forms of the present disclosure involves a photoresist that includes: a polymer having a backbone that is breakable; and a photo acid generator that is free of bonding from the polymer.

Another of the broader forms of the present disclosure involves a photoresist that includes: a photo acid generator; and a polymer that has a chemical formula:

wherein Z is cleavable from $(C)_x$, and wherein: Z includes one of carboxylic, oxygen, phosphorous, sulfur, thio, sulfoxide, sulfone, amide, and imine; wherein $R_1$ and $R_2$ each include one of: hydrogen, hydroxide, halide, aromatic carbon ring, alkyl, alkoxyl, fluoro alkyl, and fluoroalkoxyl chain having a carbon chain with a number of carbon atoms in a range from 1 to 12; and x is in a range from 1 to 6, and y is in a range from 8 to 40.

Still another of the broader forms of the present disclosure involves a method of fabricating a semiconductor device that includes: providing a substrate; forming a material layer over the substrate; forming a photoresist material over the material layer, the photoresist material having a polymer that includes a backbone; patterning the photoresist material to form a patterned photoresist layer; performing a fabrication process to the material layer, the patterned photoresist layer serving as a mask in the fabrication process; thereafter treating the patterned photoresist layer in a manner that breaks the backbone of the polymer; and removing the patterned photoresist layer.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
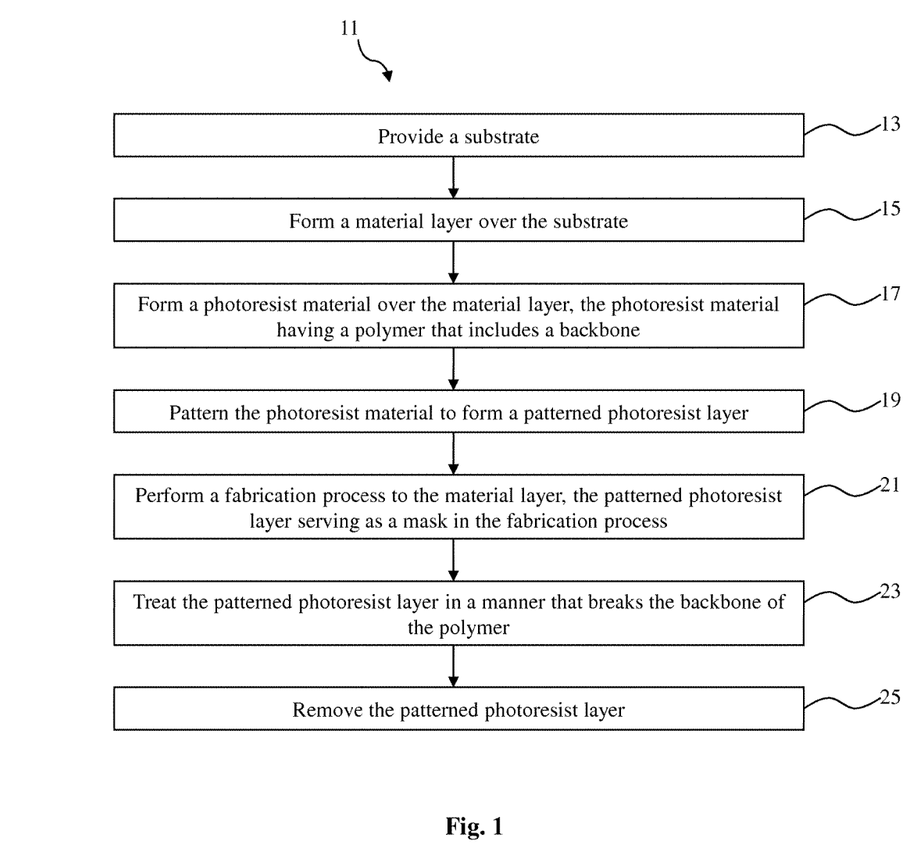
FIG. 1 is a flowchart illustrating a method for fabricating a semiconductor device according to various aspects of the present disclosure.

Illustrated in FIG. 1 is a flowchart of a method 11 of fabricating a semiconductor device according to various aspects of the present disclosure. The method 11 begins with block 13 in which a substrate is provided. The method 11 continues with block 15 in which a material layer is formed over the substrate. The method 11 continues with block 17 in which a photoresist material is formed over the material layer. The photoresist material has a polymer that includes a backbone. The method 11 continues with block 19 in which the photoresist material is patterned to form a patterned photoresist layer. The method 11 continues with block 21 in which a fabrication process is performed to the material layer. The patterned photoresist layer serves as a mask in the fabrication process. The method 11 continues with block 23 in which the patterned photoresist layer is treated in a manner that breaks the backbone of the polymer. The method 11 continues with block 25 in which the patterned photoresist layer is removed.

FIGS. 2-6 are diagrammatic fragmentary cross-sectional side views of a semiconductor device 35 at various stages of fabrication in accordance with the method of FIG. 1. The semiconductor device 35 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Figure 2:
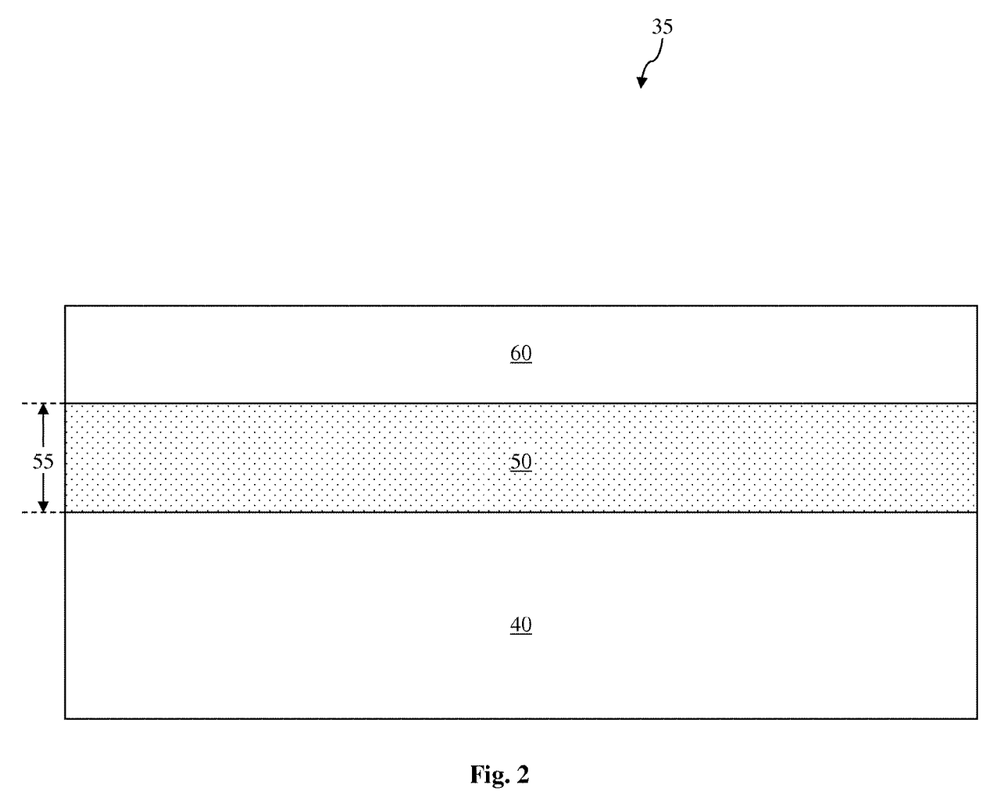
FIGS. 2, 3, 4, 5, and 6 are diagrammatic cross-sectional side views of a semiconductor device at various stages of fabrication in accordance with the method of FIG. 1.

Referring to FIG. 2, the semiconductor 35 includes a substrate 40. In one embodiment, substrate 40 is substantially conductive or semi-conductive and has an electric resistance that is less than approximately 1000 ohm-meter. In such embodiment, the substrate 40 includes a formula $MX_A$, where M is a metal, such as titanium (Ti), aluminum (Al), cobalt (Co), ruthenium (Ru), tungsten (W), or tantalum (Ta), and X is nitrogen (N), sulfur (S), selenium (Se), oxygen (O), or silicon (Si), and A is in a range from approximately 0.4 to approximately 2.5. In another embodiment, the substrate 40 includes a dielectric material with a dielectric constant that is in a range from approximately 1 to approximately 40. In that embodiment, the substrate 40 has a chemical formula $MX_B$, where M is a metal or a semi-conductive material, such as silicon (Si), aluminum (Al), hafnium (Hf), or lanthanum (La), and where X is nitrogen or oxygen, and where B is in a range from approximately 0.4 to approximately 2.5. Further, the substrate 40 could include an epitaxial layer (epi layer), may be strained for performance enhancement, and may include a silicon-on-insulator (SOI) structure.

A material layer 50 is formed over the substrate 40. The material layer 50 has a thickness 55 that is less than about 100 angstroms, or 10 nanometers (nm). In an embodiment, the material layer 50 includes a dielectric material, such as silicon oxide or silicon nitride. In another embodiment, the material layer 50 includes metal. In yet another embodiment, the material layer 50 includes a semiconductor material. It is understood that the substrate 40 and the material layer 50 may each include other suitable material compositions in other embodiments.

Referring back to FIG. 2, a photoresist material 60 is formed over the material layer 50. In the embodiment shown in FIG. 2, the photoresist material 60 includes a positive photoresist, but it is understood that the photoresist material 60 may be a negative photoresist in alternative embodiments. The photoresist material 60 is formed by a spin-coating process. The photoresist material 60 includes a polymer and a photo acid generator (PAG). The photo acid generator is not bonded to the polymer. In a subsequent photolithography process (described in more detail later), photons induce decomposition of the PAG. As a result, a small amount of acid is formed, which further induces a cascade of chemical transformations in the photoresist material 60. The photoresist material 60 may also optionally include a quencher that is disposed within the photoresist material 60 in order to improve critical dimension (CD) control. The photoresist material 60 may further include a chromophore material.

The polymer of the photoresist material 60 has a chemical formula that is listed below:

$(C)_x$ is a chain of carbon atoms that are chemically bonded together. Thus, $(C)_x$ is also referred to as a carbon chain. X is a numeric variable that denotes the number of carbon atoms are bonded together in the carbon chain. As an example, if x=4, the carbon chain would appear as C—C—C—C, which represents 4 carbon atoms that are chemically bonded together. In an embodiment, x is in a range from approximately 1 to approximately 6. A length (e.g. linear dimension) of a carbon atom is approximately 0.1 nm, thus the total length of the carbon chain has a range that is approximately 0.1 nm to approximately 0.6 nm.

Z represents a chemical that is chemically bonded (or linked) to the carbon chain. Thus, Z is also referred to as a linking group. In an embodiment, Z includes one of carboxylic, oxygen, phosphorous, sulfur, thio, sulfoxide, sulfone, amide, and imine.

The bonded structure of the carbon chain $(C)_x$ and the linking group Z is repeated y number of times to form a backbone of the polymer. As an example, if y=3, and x=4, then the backbone of the polymer would appear as C—C—C—C—Z—C—C—C—C—Z—C—C—C—C—Z. Alternatively stated, the backbone of the polymer includes 3 substantially identical segments that are bonded together, where each segment includes a linking group Z that is bonded to a carbon chain $(C)_4$ having 4 chemically bonded carbon atoms. In an embodiment, y is in a range from approximately 8 to approximately 40.

$R_1$ and $R_2$ each represent a chemical that is coupled to the carbon chain $(C)_x$, though $R_1$ and $R_2$ are not a part of the backbone of the polymer. Thus, $R_1$ and $R_2$ may also be referred to as chemical branches. In an embodiment, $R_1$ and $R_2$ each include one of: hydrogen, hydroxide, halide, aromatic and non-aromatic carbon ring, alkyl, alkoxyl, fluoro alkyl, and fluoroalkoxyl chain. The alkyl, alkoxyl, fluoro alkyl, and fluoroalkoxyl chain each have a carbon chain with a number of carbon atoms in a range from 1 to 12. The alkyl, alkoxyl, fluoro alkyl, and fluoroalkoxyl chain may each be straight or cyclic. In other embodiments, $R_1$ and $R_2$ may include Cl, Br, NO2, SO3, H, CN, NCO, OCN, CO2, OH, OR*, OC(O)CR*, SR, SO2N(R*)2, SO2R, SOR, OC(O)R*, C(O)OR*, C(O)R*, Si(OR*)3, Si(R*)3, and epoxyl groups, where R* represents H, alkyl, alkenyl, or alkynyl groups. The alkyl, alkenyl, or alkynyl groups may each have a carbon chain with 1-12 carbon atoms and may be branched or unbranched, cyclic or noncyclic, and saturated or unsaturated.

The linking group Z can be cleaved (or separated) from the carbon chain $(C)_x$ in response to an external energy applied to the photoresist material 60 (and thus applied to the polymer). In other words, the chemical bond between the linking group Z and the carbon chain $(C)_x$ can be broken in response to this external energy. In one embodiment, the external energy is a chemical. The chemical is preferably an acid, such as HCl, $H_2SO_4$, $HNO_3$, HF, and $H_3PO_4$. The chemical may alternatively be a base, such as ammonia or tetramethylammonium hydroxide (TMAH). The chemical may also be an oxidant, a reductant, or a surfactant. In another embodiment, the external energy is heat. In that case, the polymer is heated to a temperature that is in a range from approximately 22 degrees Celsius to approximately 250 degrees Celsius. In yet another embodiment, the external energy is electromagnetic radiation. In that case, the polymer is exposed to an electromagnetic wave having a wavelength that is lower than 250 nm.

In an alternative embodiment, the polymer has a chemical formula that is listed below:

In that embodiment, the polymer backbone includes a chemical $R_f$ that is bonded to both the carbon chain $(C)_x$ and the linking group Z. In an embodiment, the chemical $R_f$ includes one of: aromatic and non-aromatic carbon ring, alkyl, alkoxyl, fluoro alkyl, and fluoroalkoxyl chain. The alkyl, alkoxyl, fluoro alkyl, and fluoroalkoxyl chain each have a carbon chain with a number of carbon atoms in a range from 1 to 4.

Figure 3:
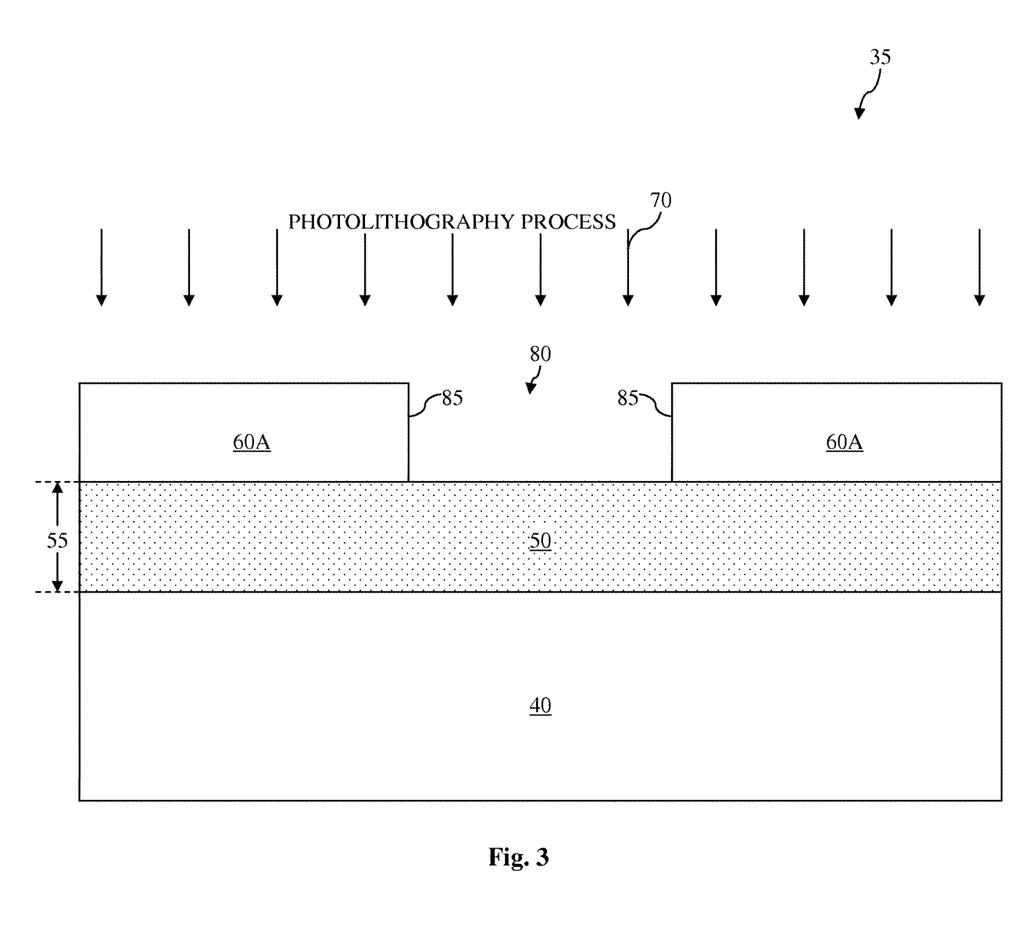

Referring now to FIG. 3, a photolithography process 70 is performed on the photoresist material 60 to form a patterned photoresist layer 60A. In an embodiment, the photolithography process 70 includes exposing a predetermined region of the photoresist material 60 while protecting other regions of the photoresist material through the use of an illumination source and a photomask. Prior to the exposure, the photoresist material 60 has a low polarity, which allows it to be dissolved in an organic solvent such as propylene glycol monomethyl ether (PGME) or propylene glycol monomethyl ether acetate (PGMEA). As a result of the exposure, a chemical reaction takes place within the regions of the photoresist material 60 that are exposed, and the exposed regions switch to a high polarity after the exposure. The high-polarity photoresist material 60 is dissolvable in a base-type (basic) material such as TMAH. Thus, following a post exposure bake (PEB) process, the exposed regions are removed in a developing process that uses TMAH as a developing solution.

In the embodiment shown in FIG. 3, removing the exposed portions of the photoresist material 60 results in an opening 80 in the photoresist material, and the remaining unexposed photoresist material is referred to as a patterned photoresist layer 60A. The opening 80 has edges 85 that denote the desired boundaries or demarcation line between the exposed regions and unexposed regions of the photoresist layer 60. However, due to technological limitations of the photolithography process 70, the edges 85 may not be sharp or well-defined, but may actually include a somewhat gradual transition from the exposed region to the unexposed region. In other words, the edges 85 may not have a clear or sharp profile. This may lead to difficulties in removing the patterned photoresist layer 60A in a later process, which will be discussed in more detail below.

Figure 4:
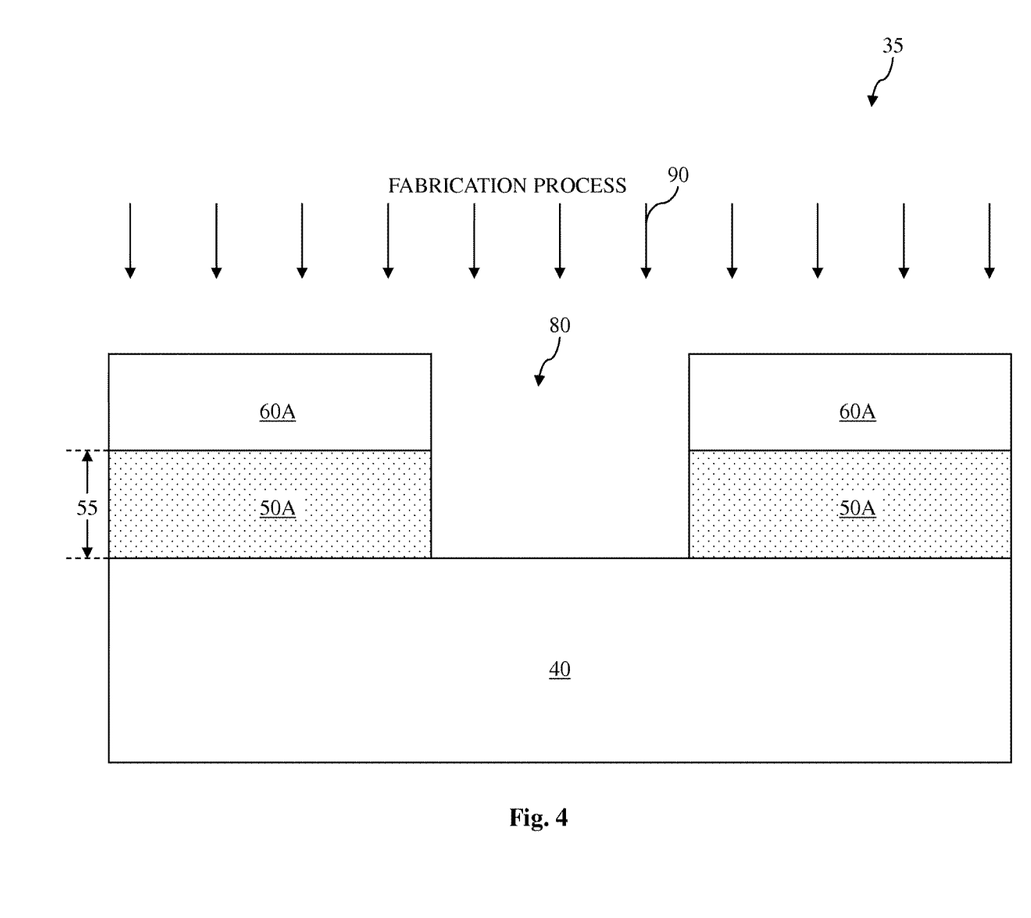

Referring to FIG. 4, a fabrication process 90 is performed on the semiconductor device 35. In an embodiment, the fabrication process 90 is an etching process. The fabrication process 90 is a wet etching process where an etching chemical is used to etch the material layer 50. To avoid damaging the substrate 40, etching chemicals with strong etching properties such as HF or $H_3PO_4$ are not used to carry out the fabrication process 90. Instead, an etching chemical with more gentle etching properties is carefully chosen to carry out the fabrication process 90. The fabrication process 90 may alternatively be a weak dry etching process, where a plasma gas with weak etching properties such as $CF_4$, $SF_6$, or $NF_3$ is used to etch the material layer 50.

In any case, there is etching selectivity between the material layer 50 and the patterned photoresist layer 60A, which means the material layer 50 and the patterned photoresist layer 60A have different etching rates in response to the etching chemical. The patterned photoresist layer 60A is used as a mask in the etching process. At the end of the etching process, the image pattern of the patterned photoresist layer 60A is transferred to the material layer 50 as patterned material layer 50A. Alternatively stated, the patterned photoresist layer 60A is used as a mask to extend the opening 80 through the material layer 50.

In an alternative embodiment, the fabrication process 90 is an implantation process. In that case, dopants such as boron, arsenic, or phosphorous are implanted to the material layer 50 through the opening 80 to form a doped region in the material layer 50. The patterned photoresist layer 60A is used as a mask to protect regions of the material layer 50 therebelow during the implantation process. For the sake of simplicity, this alternative embodiment is not illustrated.

Figure 5:
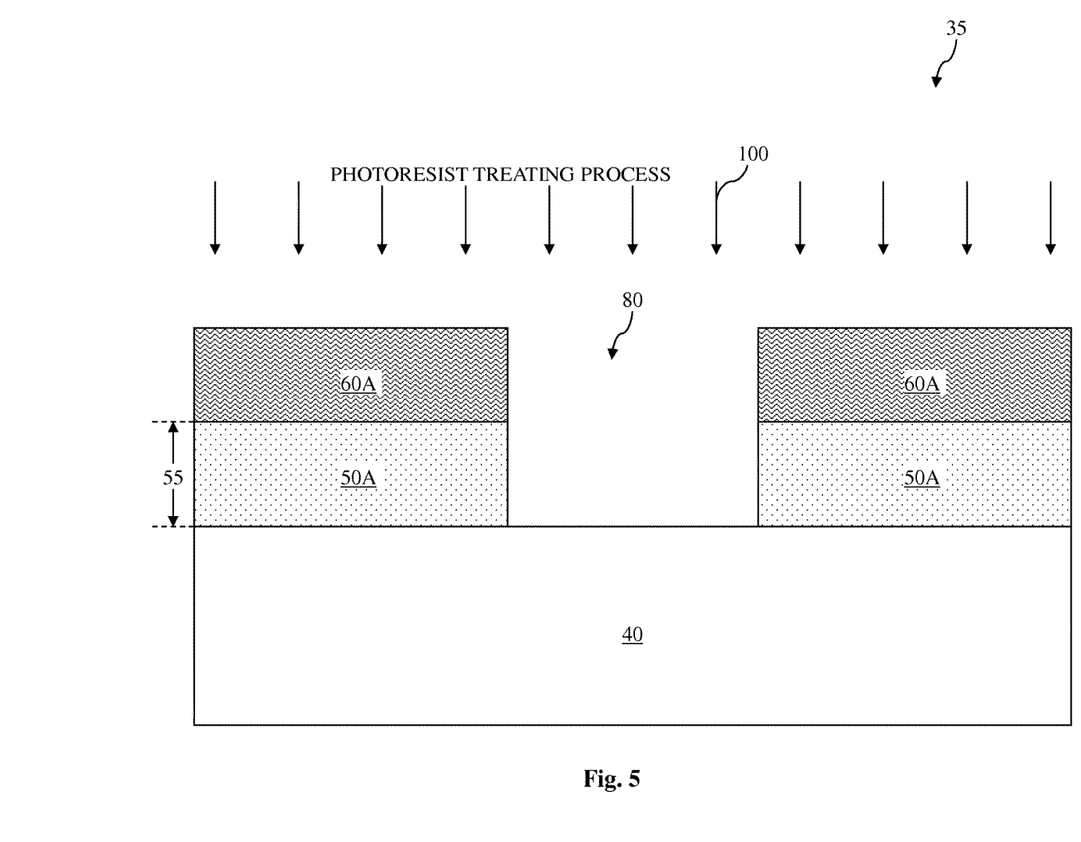

Referring to FIG. 5, a treating process 100 is performed on the patterned photoresist layer 60A to transform the backbone structure of the polymer, specifically, to break up the backbone of the polymer. In an embodiment, the treating process 100 includes subjecting the patterned photoresist layer 60A to a chemical process. In the chemical process, the patterned photoresist layer 60A is exposed to an acid, such as HCl, $H_2SO_4$, $HNO_3$, HF, or $H_3PO_4$. The exposure to acid cleaves or separates the linking group Z from the carbon chain, thus breaking up the backbone of the polymer. The cleaving of the backbone may also be accomplished by exposing the patterned photoresist layer 60A to a base such as ammonia or TMAH, or an oxidant such as $H_2O_2$ or $HNO_3$, or a surfactant such as poly alkyoxide or fluoroalky salt, or a reductant. The duration of the chemical process may be tuned to control the degree of backbone cleaving.

In an alternative embodiment, the treating process 100 includes a thermal process. The patterned photoresist layer 60A is heated to a desired temperature range through the thermal process. In an embodiment, the patterned photoresist layer 60A is heated to a temperature that is in a range from approximately 22 degrees Celsius to approximately 250 degrees Celsius. The thermal process may generate acid, which serves to cleave the backbone of the polymer by breaking or otherwise separating the linking group Z from the carbon chain. The duration and the temperatures of the thermal process may be tuned to produce the desired amount and type of acid suitable for cleaving the backbone of the polymer.

In yet another embodiment, the treating process 100 includes an electromagnetic radiation process. The patterned photoresist layer 60A is exposed to an electromagnetic wave having a wavelength that is less than 250 nm. The wavelength of the electromagnetic wave and the duration of the electromagnetic radiation process may be tuned such that exposure to the electromagnetic wave may produce the desired amount and type of acid suitable for cleaving the backbone of the polymer.

Figure 6:
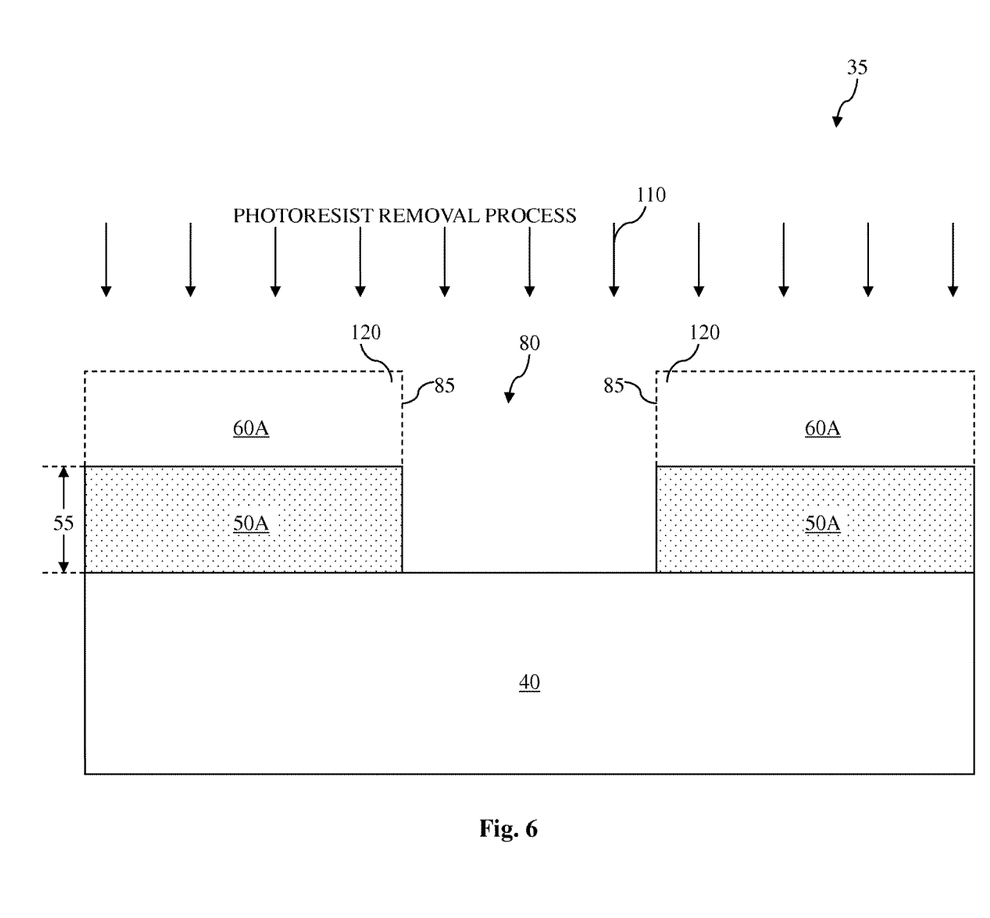

Referring now to FIG. 6, a photoresist removal process 110 (also referred to as a stripping process) is applied on the semiconductor device 35 to remove the patterned photoresist layer 60A. For the sake of illustration, the removed patterned photoresist layer 60A is illustrated in broken lines. Conventional methods of removing photoresist may include stripping the photoresist using a dry plasma gas or a corrosive solution (e.g. $H_2SO_4$ or $H_2O_2$), or dissolving the photoresist using an organic solvent. However, each of these conventional photoresist removal processes has drawbacks. If the dry plasma gas or corrosive solution is used, the layers (such as the substrate 40 or the material layer 50) below the photoresist may be damaged during the removal of the photoresist. If the organic solvent is used, it may result in incomplete photoresist removal, particularly near boundary regions 120 of the patterned photoresist layer that are near the edges 85 of the opening 80. This is explained in more detail below.

Prior to the treating process 100 (FIG. 5), the polymer backbone of the patterned photoresist layer 60A has a multidendate form. Due to a chelate effect, the polymer has strong adhesion to layers therebelow, including the material layer 50A. Such strong adhesion force makes it difficult to remove the patterned photoresist layer 60A from the layers therebelow. The difficulty is even greater in the boundary regions 120. As discussed above with reference to FIG. 3, the exposed regions of the photoresist layer 60 have a high polarity, and the unexposed regions have a low polarity. Further, technological limitations of the photolithography process 70 may not be able to produce a sharp demarcation line between the exposed regions and unexposed regions of the photoresist layer 60. As a result, the photoresist material in the boundary regions 120 may not have a distinctly high polarity or a distinctly low polarity, but may rather have a transitional polarity—meaning that it is somewhere between high polarity and low polarity. It is understood that high-polarity photoresist can be dissolved in a basic solution such as TMAH, and low-polarity photoresist can be dissolved in an organic solvent such as PGME and PGMEA. However, since the photoresist the boundary regions 120 have neither a high polarity nor a low polarity, it is semi-soluble to either the basic solution or the organic solvent. Thus, the photoresist in the boundary regions 120 is not easily removed using either the basic solution or the organic solvent. The strong adhesion between the patterned photoresist layer 60A and the layers therebelow further compounds the problem and enhances the difficulty of removing the photoresist in the boundary regions 120. Thus, due to the issues discussed above, often times photoresist residue will remain (particularly in the boundary regions 120) even after a conventional photoresist stripping process has been performed.

In comparison with traditional photoresist removal methods, one of the advantages offered by the present disclosure includes easier and more comprehensive photoresist removal, it being understood that different embodiments may offer different advantages, and that no particular advantage is necessarily required for all embodiments. As discussed above, the treating process 100 separates the linking group Z from the carbon chain so as to break up, or cleave, the backbone of the polymer. Thus, the polymer backbone no longer has a multidendate form but has a monodendate form after the treating process 100, and thus the chelate effect is substantially absent. Consequently, the adhesion force between the polymer and the layers therebelow is substantially reduced or weakened. In some cases, the adhesion force may be reduced by factors on the order of thousands or tens of thousands. Due to the much weaker adhesion force, the patterned photoresist layer 60 (including the photoresist in the boundary regions 120) may be more easily removed by an organic solvent such as PGME or PGMEA. Further, since no dry plasma gas or corrosive solution is used, the layers below the patterned photoresist layer 60, such as the substrate 40, would not suffer unnecessary damage. In fact, the substrate 40 can handle the organic solvent PGME or PGMEA relatively well. After the photoresist removal process 110 is performed, no substantial amount of photoresist residue will remain.

It is understood that, although FIGS. 2-6 of the present disclosure illustrate transferring the image pattern of a patterned photoresist layer 60A to the material layer 50 therebelow, in other embodiments, the material layer 50 may not be needed, and that the substrate 40 may be patterned by the patterned photoresist layer 60A instead.

In another embodiment, the photoresist treating process 100 may be applied to a conventional photoresist material. However, since the conventional photoresist lacks the cleavable polymer backbone that the photoresist material 60 (FIG. 2) has, the conventional photoresist would still have relatively strong adhesion to the layers below after the photoresist treating process 100 is performed. As such, instead of an organic solvent, a basic solution such as TMAH may be used to remove the conventional photoresist in the photoresist removal process 110. However, a possible drawback of using the basic solution to remove the photoresist is that it may also corrode or destroy the patterned layers below the photoresist.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of fabricating a semiconductor device, comprising:
    forming a material layer over a substrate;
    forming a photoresist over the material layer, the photoresist having a photo acid generator and a polymer having a backbone that is breakable, the backbone including a plurality of repeating segments with each of the repeating segments comprising a carbon chain having a plurality of carbon atoms, a linking group coupled to the carbon chain and breakable from the carbon chain, and a chemical connected to the carbon chain and the linking group, wherein the carbon chain and the chemical have different chemical structures;
    patterning the photoresist to form a patterned photoresist layer;
    performing a fabrication process to the material layer, the patterned photoresist layer serving as a mask in the fabrication process;
    thereafter treating the patterned photoresist layer to break the backbone of the polymer, wherein the treating of the patterned photoresist layer to break the backbone of the polymer includes treating the patterned photoresist layer with a process selected from the group of a chemical process and a thermal process; and
    removing the patterned photoresist layer.

2. The method of claim 1, wherein the forming the photoresist is carried out in a manner so that the backbone has a multidendate structure before the treating, and wherein the treating the patterned photoresist layer is carried out in a manner so that the backbone has a monodendate structure after the treating.

3. The method of claim 1, wherein the chemical process includes applying one of HCl, $H_2SO_4$, $HNO_3$, HF, or $H_3PO_4$, to the patterned photoresist layer.

4. The method of claim 1, wherein the thermal process includes heating the patterned photoresist layer to a temperature that is in a range from 22 degrees Celsius to 250 degrees Celsius.

5. The method of claim 1, wherein the removing the patterned photoresist layer includes dissolving the patterned photoresist layer with an organic solvent.

6. The method of claim 1, wherein the performing the fabrication process includes one of:
etching the material layer; and
implanting dopants into the material layer.

7. A method of fabricating a semiconductor device, comprising:
forming a material layer over a substrate;
forming a photoresist over the material layer, the photoresist having a photo acid generator and a polymer having a backbone that is breakable, the backbone including a plurality of repeating segments with each of the repeating segments comprising a carbon chain having a plurality of carbon atoms, a linking group coupled to the carbon chain and breakable from the carbon chain, and a chemical connected to the carbon chain and the linking group, wherein the carbon chain and the chemical have different chemical structures;
patterning the photoresist to form a patterned photoresist layer; and
thereafter applying a chemical treatment to the patterned photoresist layer that breaks the backbone of the polymer.

8. The method of claim 7, wherein the forming of the photoresist is carried out in a manner so that the backbone of the polymer has a chemical formula:

and wherein:
Z is the linking group, which includes one of carboxylic, oxygen, phosphorous, sulfur, thio, sulfoxide, sulfone, amide, or imine;
$R_1$ and $R_2$ each include one of: hydrogen, hydroxide, halide, aromatic carbon ring, alkyl, alkoxyl, fluoro alkyl, or fluoroalkoxyl chain having a carbon chain with a number of carbon atoms in a range from 1 to 12;
$R_f$ is the chemical, which includes one of: aromatic carbon ring, alkyl, alkoxyl, fluoro alkyl, or fluoroalkoxyl chain having a carbon chain with a number of carbon atoms in a range from 1 to 4; and
x is in a range from 2 to 6, and y is in a range from 8 to 40.

9. The method of claim 7, wherein the applying of the chemical treatment comprises applying one of HCl, $H_2SO_4$, $HNO_3$, HF, or $H_3PO_4$, to the patterned photoresist layer.

10. The method of claim 7, wherein the applying of the chemical treatment to the patterned photoresist layer includes applying an acid to the patterned photoresist layer.

11. The method of claim 7, wherein the applying of the chemical treatment to the patterned photoresist layer includes applying an oxidant or a surfactant to the patterned photoresist layer.

12. A method of fabricating a semiconductor device, comprising:
forming a photoresist over a material layer over a substrate, the photoresist comprising a polymer having a breakable backbone, the backbone including a plurality of repeating segments with each of the segments comprising a carbon chain that includes a plurality of carbon atoms, a linking group coupled to the carbon chain and breakable from the carbon chain, and a chemical connected to the carbon chain and the linking group, wherein the carbon chain and the chemical have different chemical structures;
patterning the photoresist to form a patterned photoresist layer;
performing a fabrication process to at least the material layer, wherein the patterned photoresist layer serves as a mask in the fabrication process; and
after the fabrication process, treating the patterned photoresist layer to break the backbone of the polymer, wherein the treating of the patterned photoresist layer to break the backbone of the polymer includes treating the patterned photoresist layer with a process selected from the group consisting of a chemical process and a thermal process; and
removing the patterned photoresist layer.

13. The method of claim 12, wherein the backbone of the polymer has a chemical formula:

and wherein:
Z is the linking group, which includes one of carboxylic, oxygen, phosphorous, sulfur, thio, sulfoxide, sulfone, amide, or imine;
$R_1$ and $R_2$ each include one of: hydrogen, hydroxide, halide, aromatic carbon ring, alkyl, alkoxyl, fluoro alkyl, or fluoroalkoxyl chain having a carbon chain with a number of carbon atoms in a range from 1 to 12;
$R_f$ is the chemical, which includes one of: aromatic carbon ring, alkyl, alkoxyl, fluoro alkyl, or fluoroalkoxyl chain having a carbon chain with a number of carbon atoms in a range from 1 to 4; and
x is in a range from 2 to 6, and y is in a range from 8 to 40.

14. The method of claim 12, wherein the backbone has a multidendate structure before the treating, and a monodendate structure after the treating.

15. The method of claim 12, wherein the linking group is breakable from the carbon chain in response to exposure to one of acid, thermal energy, and electromagnetic radiation.

16. The method of claim 12, wherein the treating of the patterned photoresist layer with the chemical process includes applying an acid to the patterned photoresist layer.

17. The method of claim 12, wherein the treating of the patterned photoresist layer with the chemical process includes applying an oxidant or a surfactant to the patterned photoresist layer.

18. The method of claim 12, wherein the photoresist further comprises a photo acid generator.

19. The method of claim 12, wherein the treating of the patterned photoresist layer with the thermal process includes heating the patterned photoresist layer to a temperature that is sufficiently high for the patterned photoresist layer to produce an acid.

20. The method of claim 12, wherein the treating of the patterned photoresist layer with the chemical process includes applying one of HCl, $H_2SO_4$, $HNO_3$, HF, or $H_3PO_4$, to the patterned photoresist layer.

\* \* \* \* \*